United States Patent [19]
Liu et al.

[11] Patent Number: 6,086,730
[45] Date of Patent: Jul. 11, 2000

[54] METHOD OF SPUTTERING A CARBON PROTECTIVE FILM ON A MAGNETIC DISK WITH HIGH SP³ CONTENT

[75] Inventors: Wen Hong Liu, San Jose; Gang Peng, Milpitas; Tsutomu Yamashita, San Jose; Tu Chen, Monte Sereno, all of Calif.

[73] Assignee: Komag, Incorporated, San Jose, Calif.

[21] Appl. No.: 09/298,107

[22] Filed: Apr. 22, 1999

[51] Int. Cl.⁷ .................................................. C23C 14/34
[52] U.S. Cl. .............................. 204/192.16; 204/192.15; 204/192.12; 204/192.13; 204/298.12; 204/298.13; 204/298.06; 204/298.03; 204/298.02; 204/298.08
[58] Field of Search .................... 204/192.15, 192.16, 204/298.12, 298.13, 298.06, 192.13, 192.12, 298.03, 298.02, 298.08; 360/135, 133

[56] References Cited

U.S. PATENT DOCUMENTS

| | | | |
|---|---|---|---|
| 5,045,165 | 9/1991 | Yamashita | 204/192.16 |
| 5,507,930 | 4/1996 | Yamashita et al. | 204/192.15 |
| 5,858,477 | 1/1999 | Veerasamy et al. | 427/562 |
| 5,873,984 | 2/1999 | Cheng et al. | 204/192.16 |

FOREIGN PATENT DOCUMENTS

WO 99/14746  3/1999  WIPO .

OTHER PUBLICATIONS

King, F. K., "Datapoint Thin Film Media," IEEE Transaction on Magnetics, vol. Mag. 17, No. 4, Jul. 1981, pp. 1376–1379.

Knight et al., "Characterization of Diamond Films by Raman Spectroscopy," Journal of Materials Research, vol. 4, No. 2, Mar./Apr. 1989, pp. 385–393.

Sharma et al., "Growth of Diamond Films and Characterization by Raman, Scanning Electron Microscopy, and X–Ray Photoelectron Spectroscopy," Journal of Material Research, vol. 5, No. 11, Nov. 1990, pp. 2424–2432.

Tsai et al., "Structure and Properties of Sputtered Carbon Overcoats on Rigid Magnetic Media Disks," Journal of Vacuum Science Technology, A 6 (4), Jul./Aug. 1988, pp. 2307–2315.

Weiler et al., "Preparation and Properties of Highly Tetrahedral Hydrogenated Amorphous Carbon," Physical Review B, vol. 53, No. 3, Jan. 15, 1996, pp. 1594–1608.

WPI Acc No. 99–287462/199924 for WO 99/14746, Mar. 1999.

*Primary Examiner*—Alan Diamond
*Attorney, Agent, or Firm*—Keith G. Askoff

[57] ABSTRACT

Sputtering method for producing amorphous hydrogenated carbon thin films with high sp³ content. By sputtering the carbon with a pulsed DC power supply having high voltage peaks, a carbon film with remarkably high sp³ bonding fraction can be obtained. Previously, carbon films with a very high sp³ fraction film with content as high (e.g. as 80%) could only be produced by methods such as filtered cathodic arc deposition or chemical vapor deposition methods (CVD) such as plasma-enhanced chemical vapor deposition (PE-CVD) and ion-beam deposition operating at some narrowly defined range of deposition conditions. It is very advantageous to use sputtering to create a high sp³ content film, since sputtering is more manufacturable and has higher productivity compared to CVD or ion-beam deposition methods. The resultant carbon film has excellent durability and corrosion resistance capability down to very low thickness. Also compared to PE-CVD and ion-beam deposition, the new sputtering process produce much less particles and the process can be run on a manufacturing tool for much longer time, thereby increasing the productivity of the machine, and providing disks with higher quality.

67 Claims, 11 Drawing Sheets

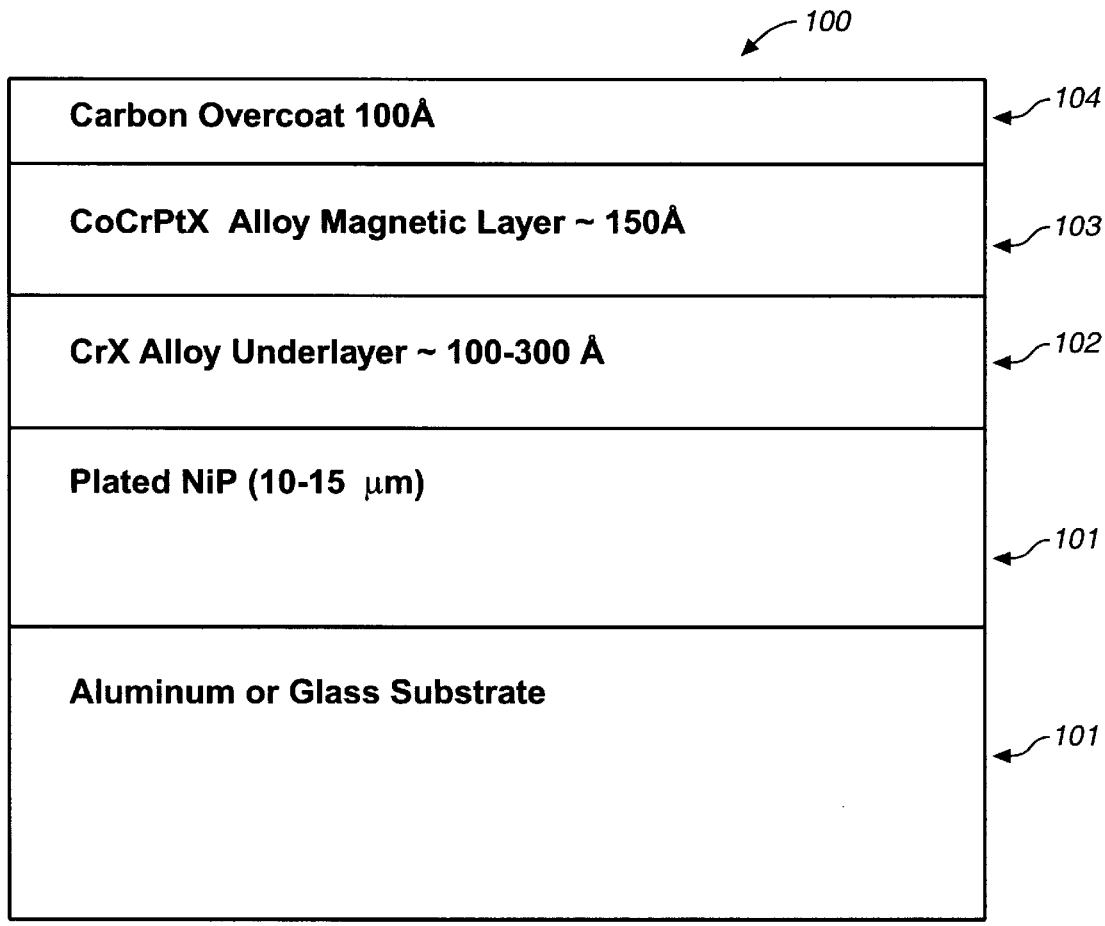
FIG._1

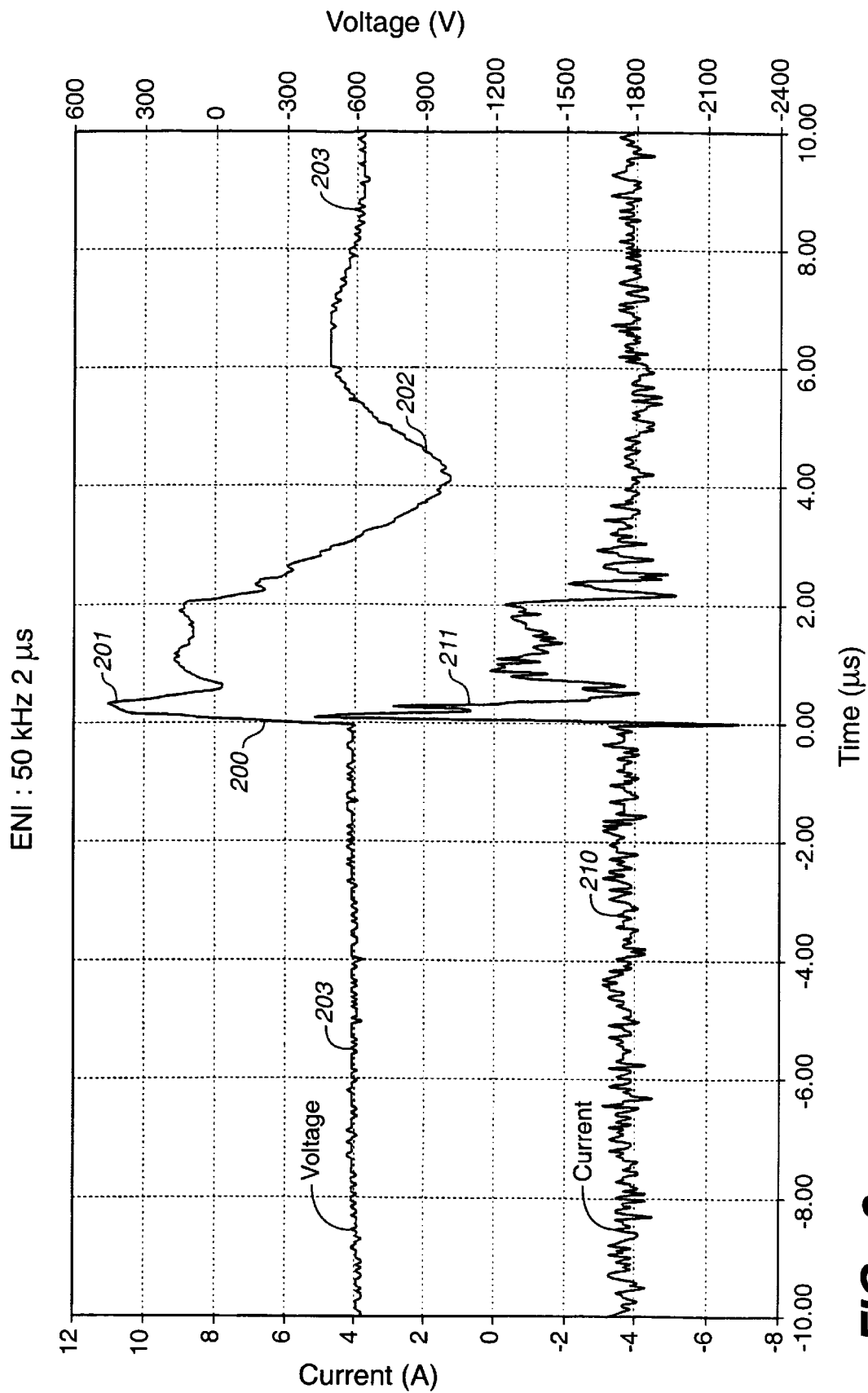
FIG._2

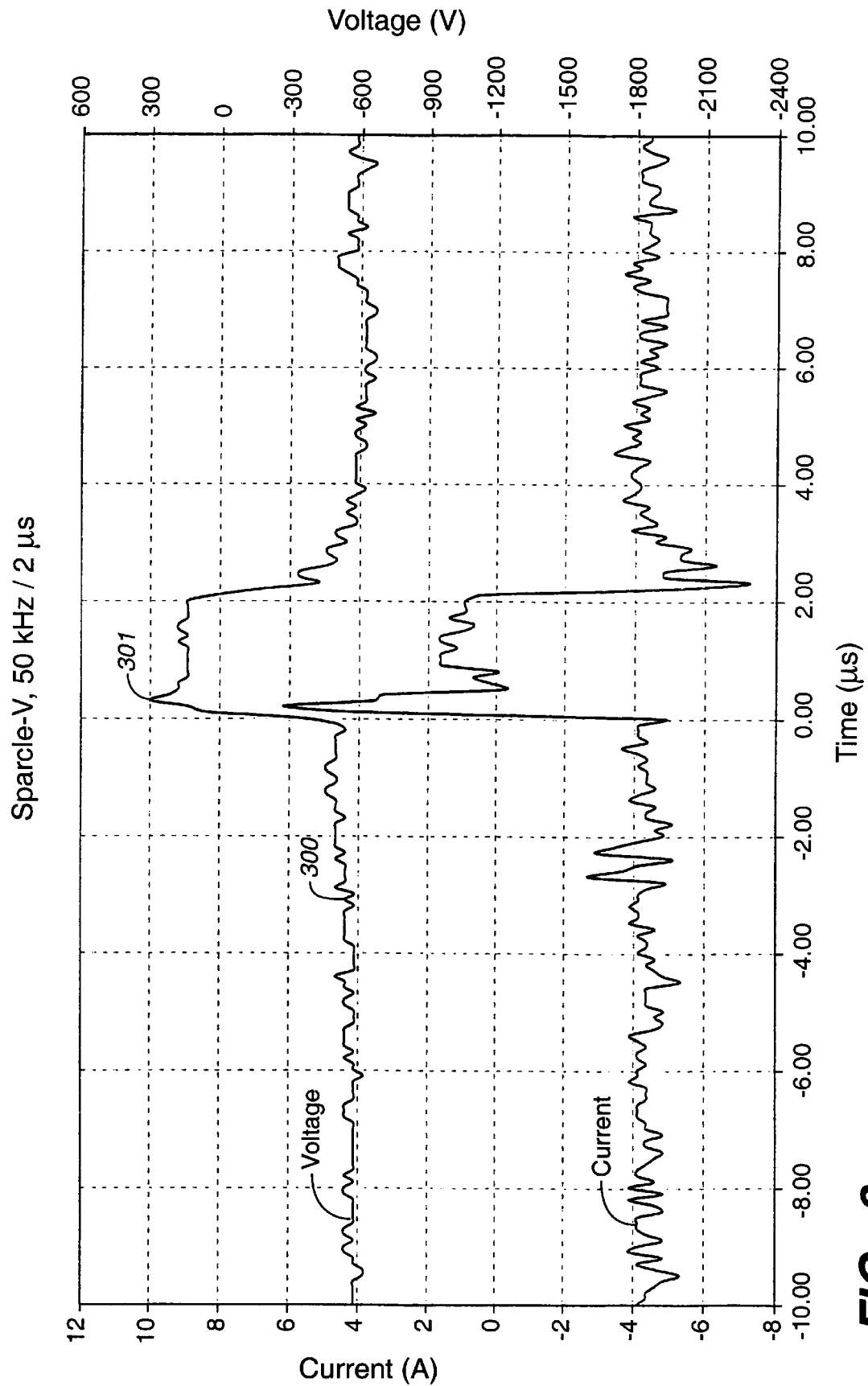
FIG._3

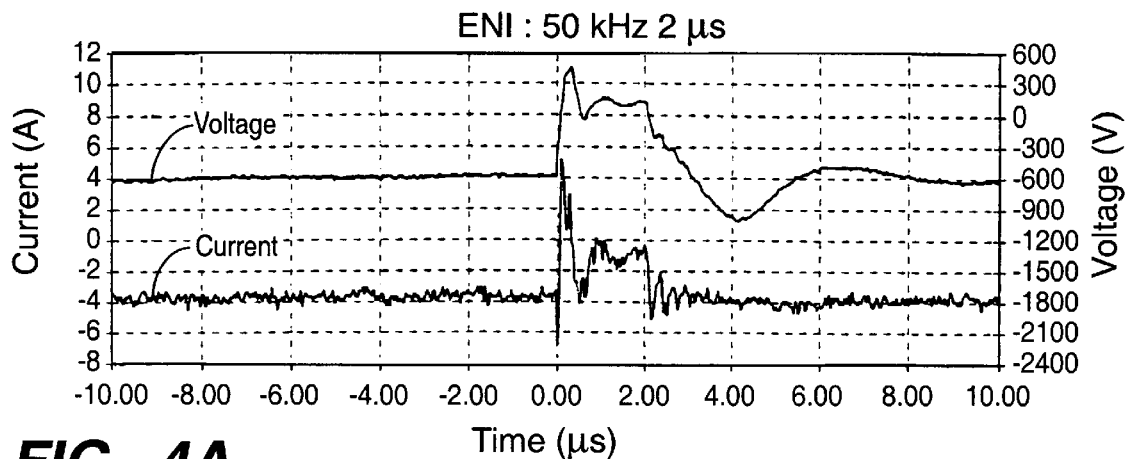
FIG._4A
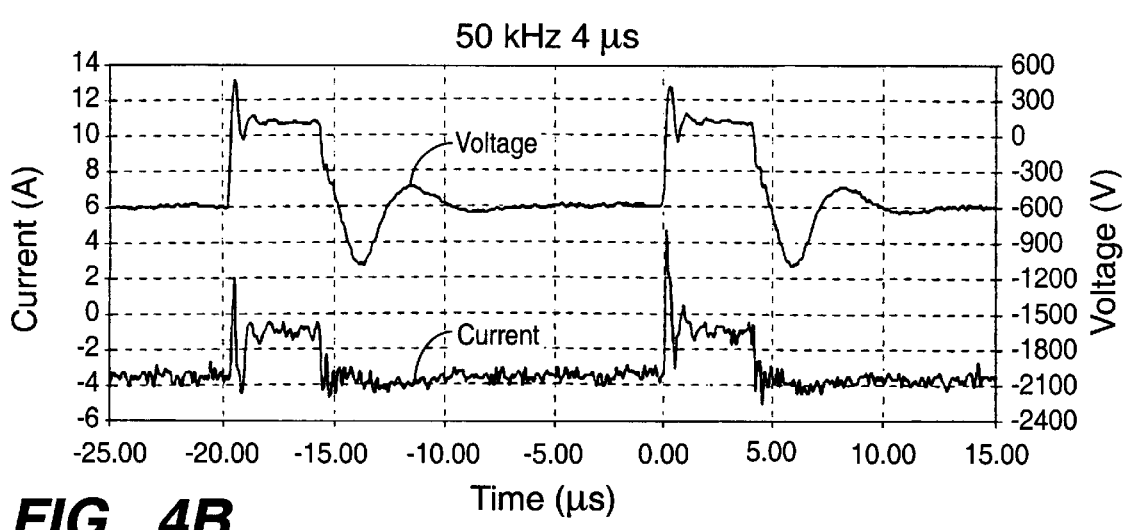
FIG._4B
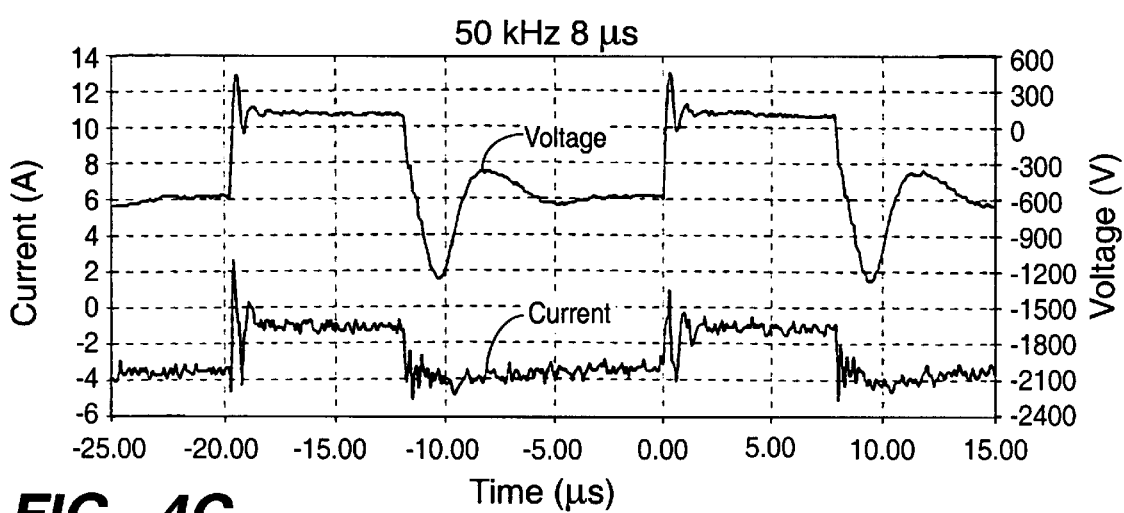
FIG._4C

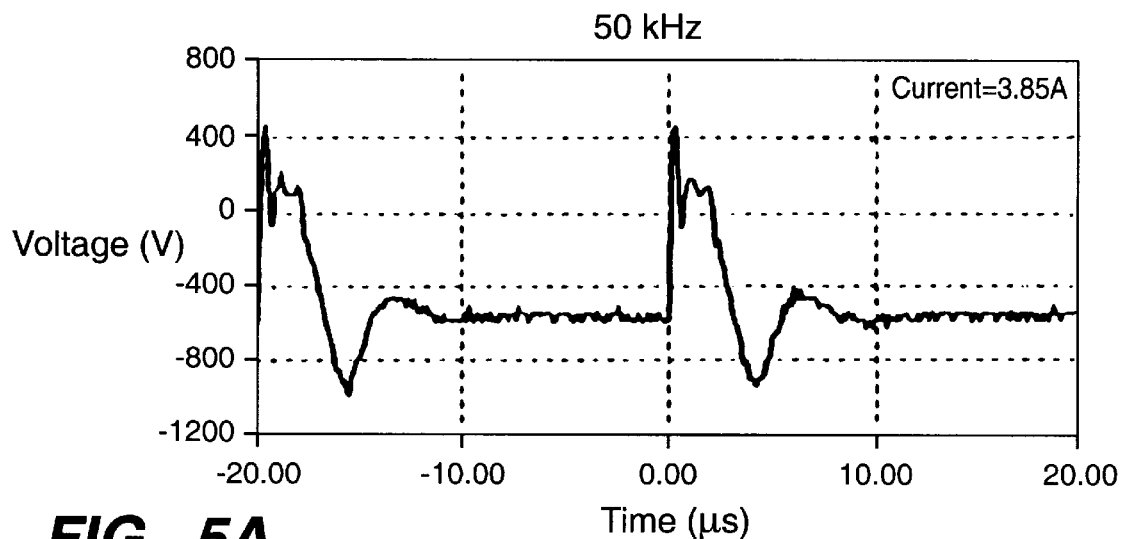
FIG._5A
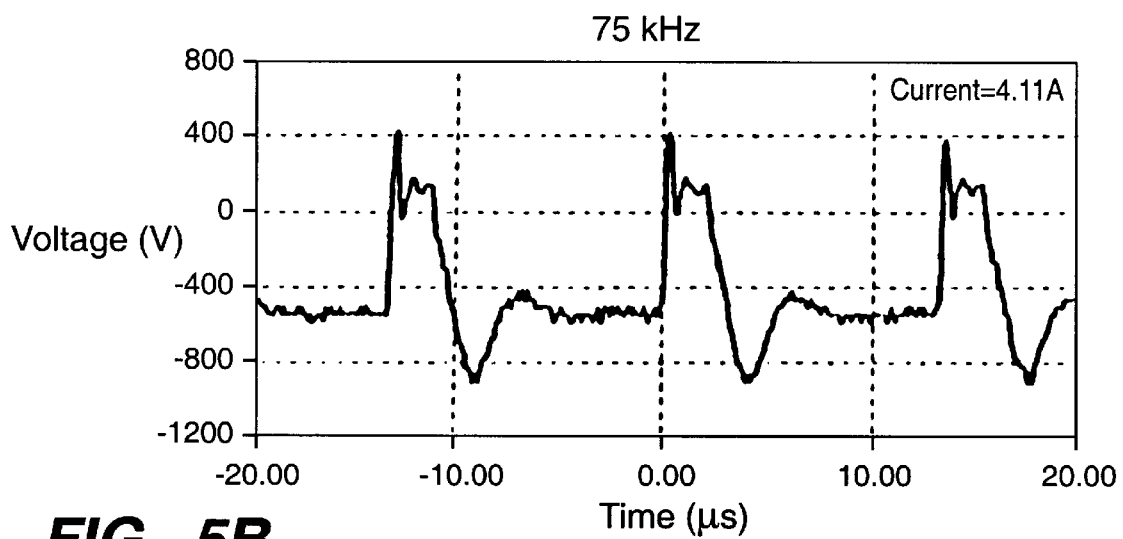
FIG._5B
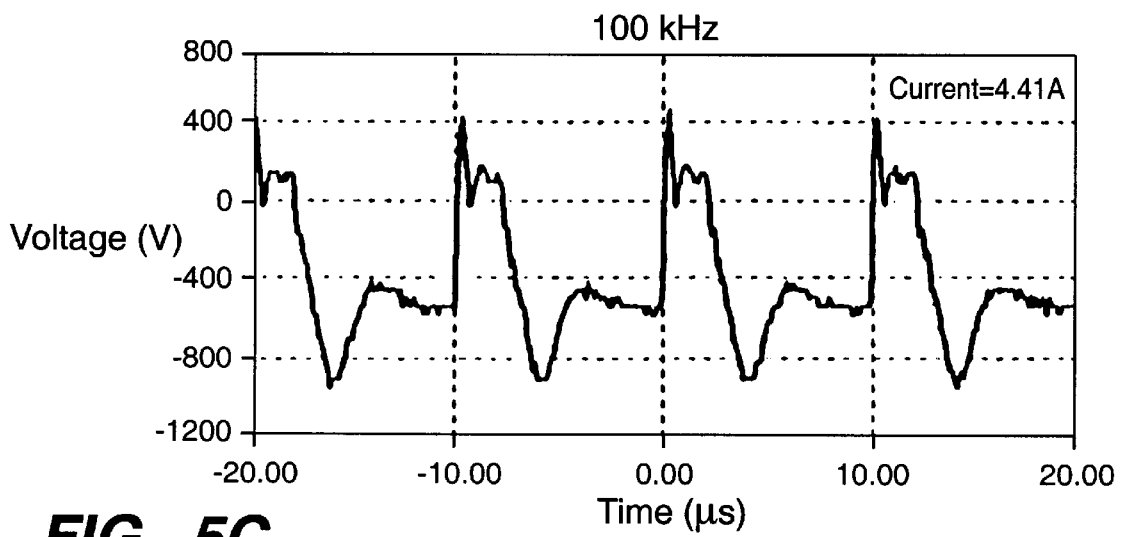
FIG._5C

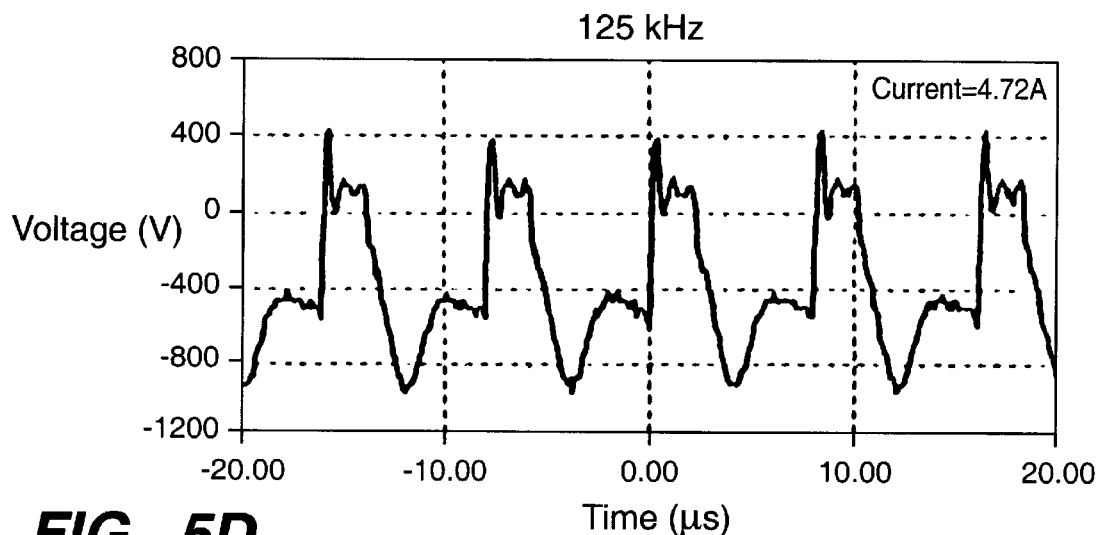
FIG._5D
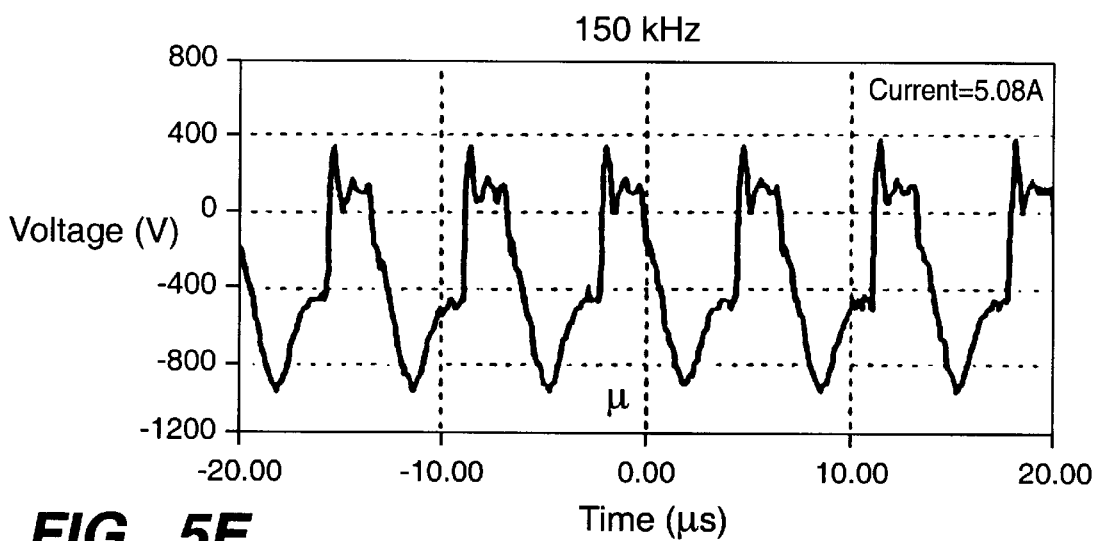
FIG._5E
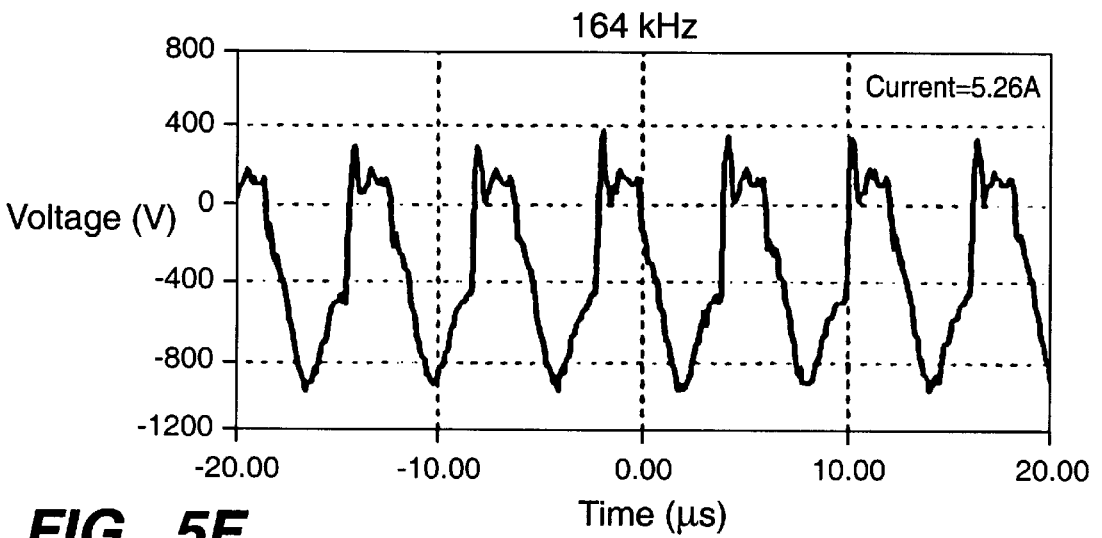
FIG._5F

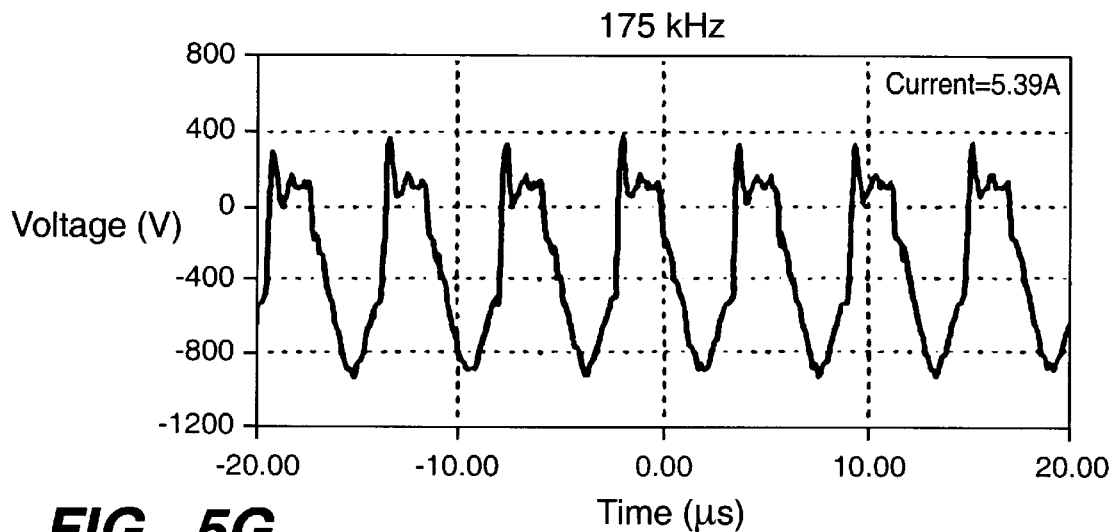
FIG._5G
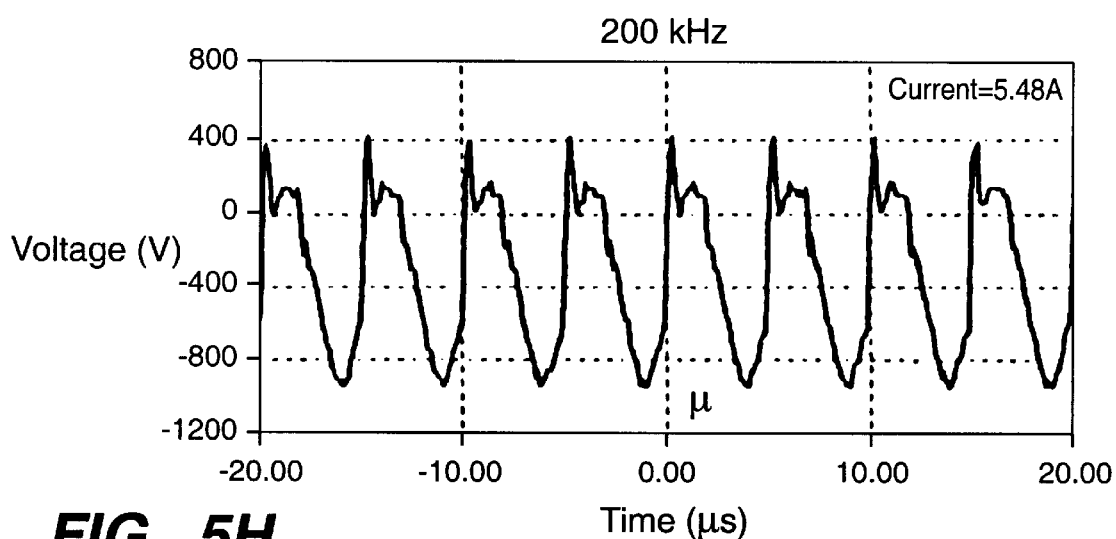
FIG._5H
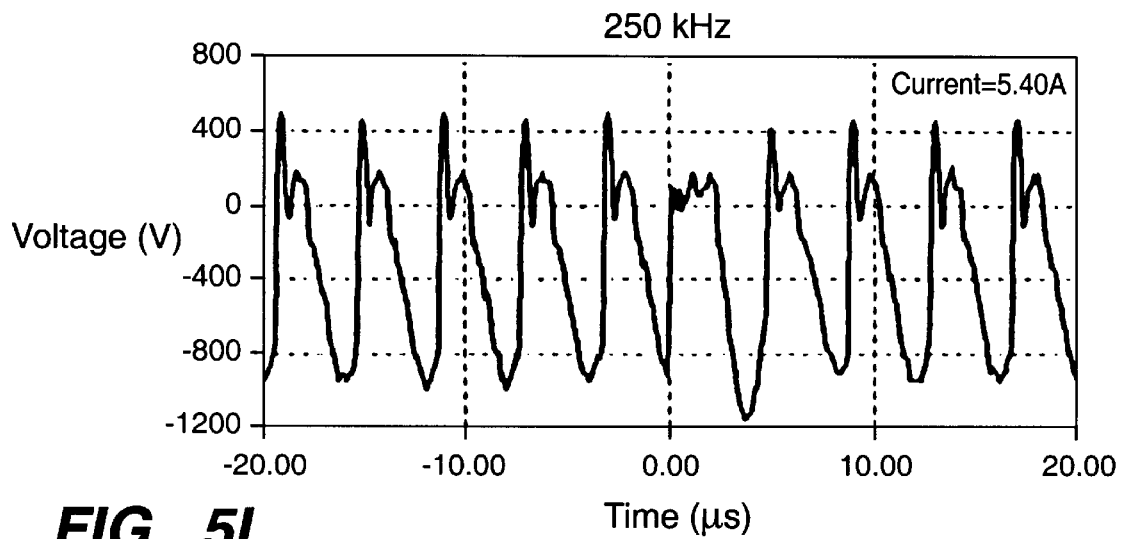
FIG._5I

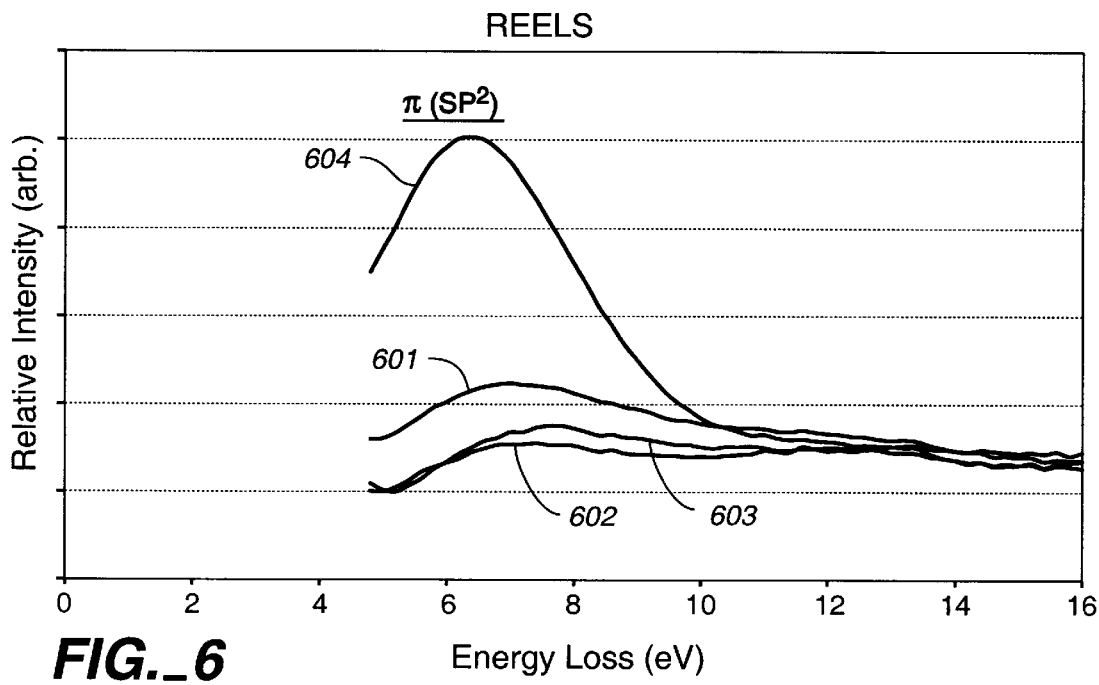
FIG._6
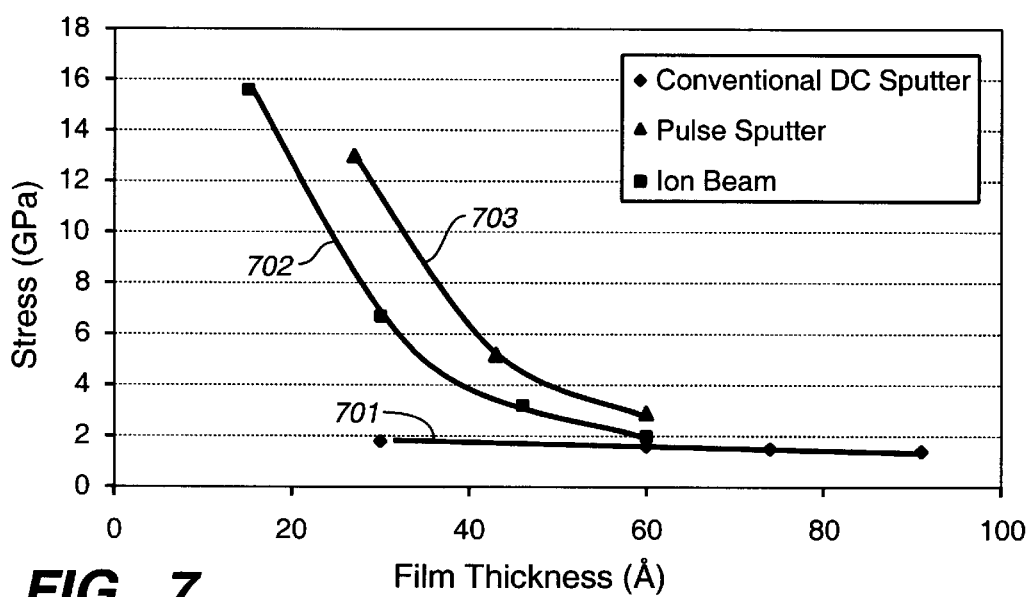
FIG._7

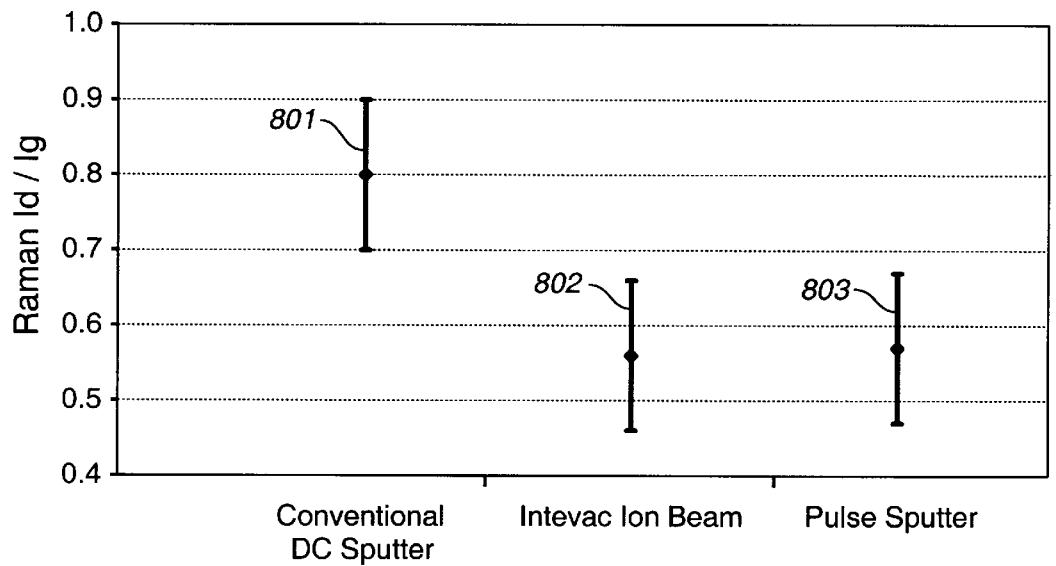
FIG._8
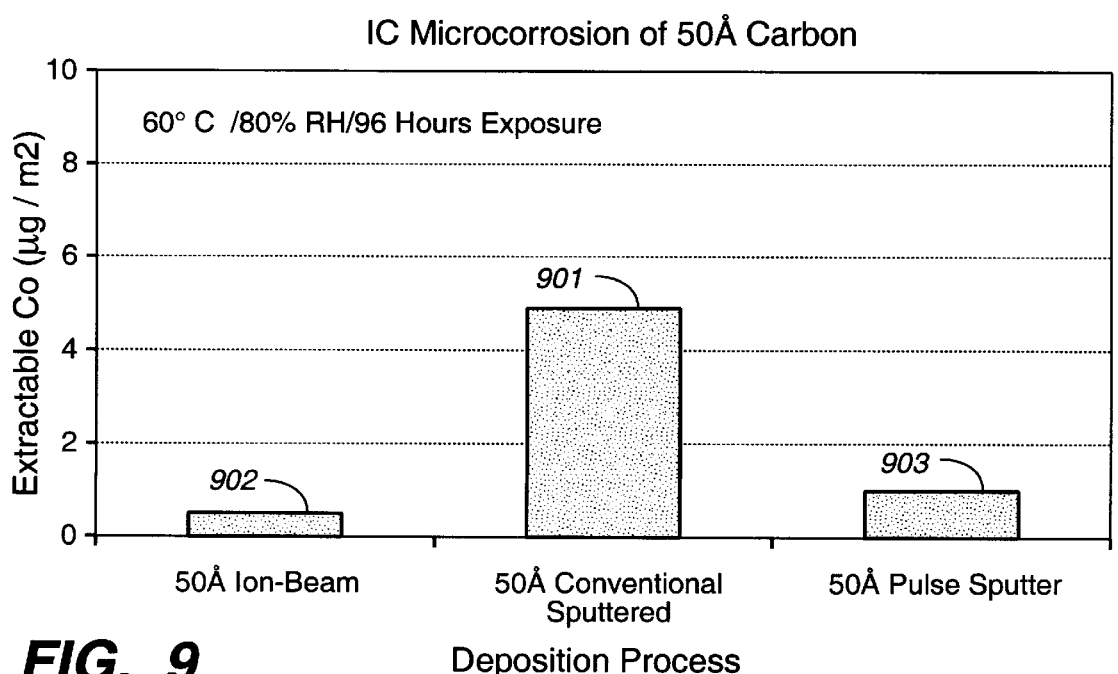
FIG._9

FIG._10
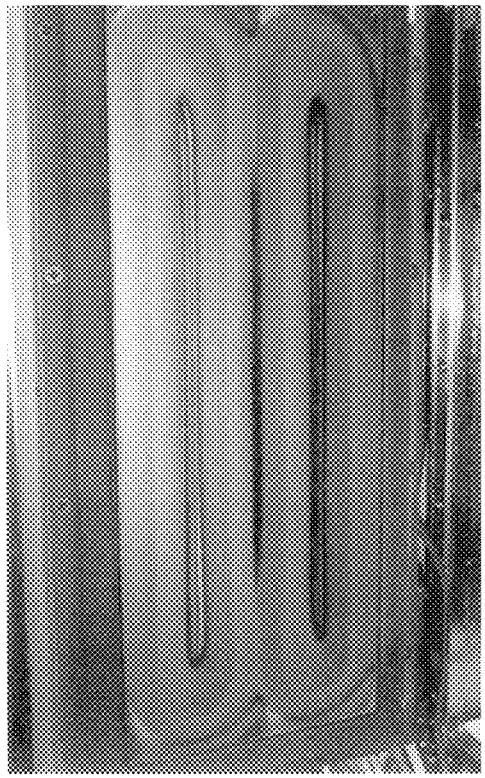
FIG._11

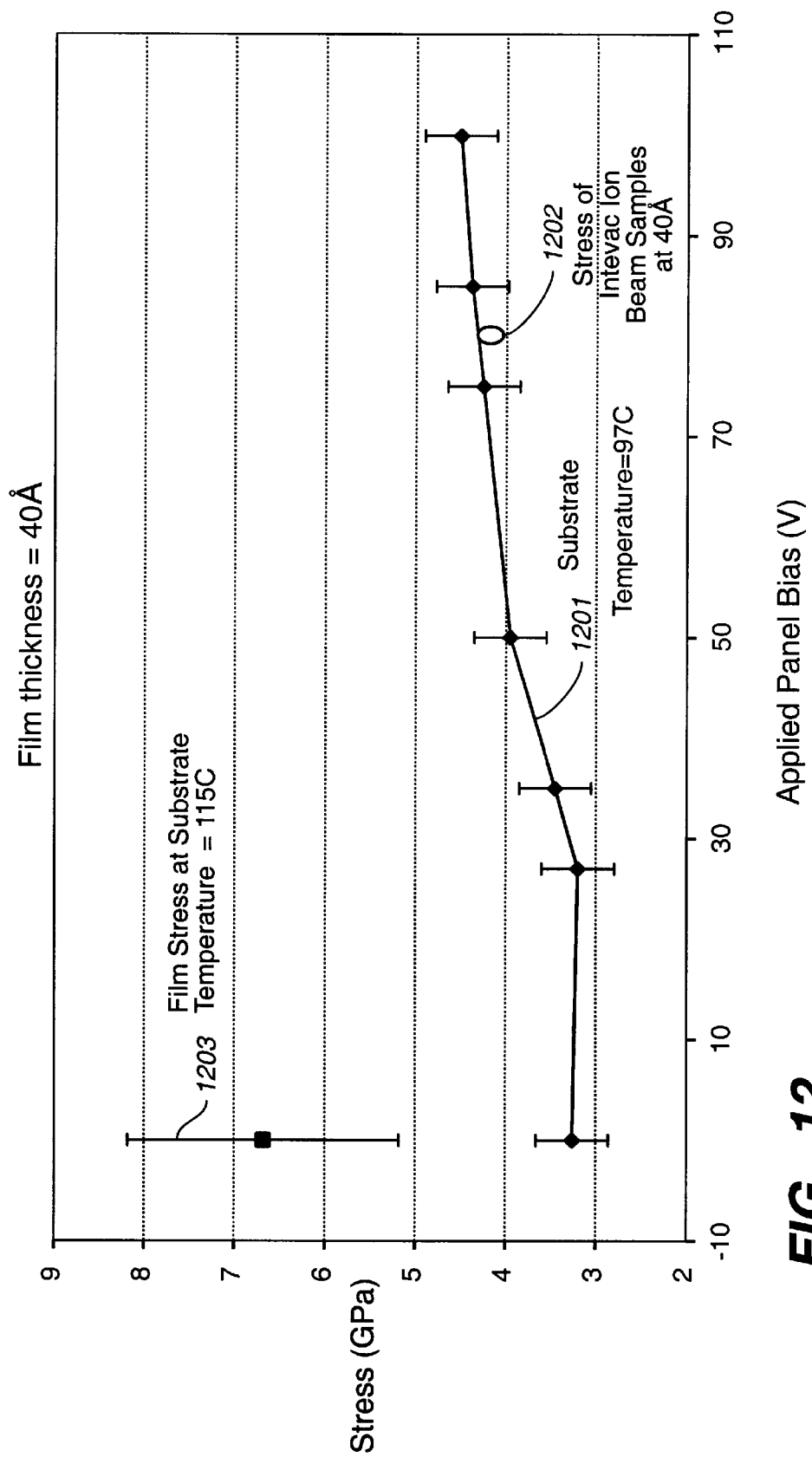
FIG._12

METHOD OF SPUTTERING A CARBON PROTECTIVE FILM ON A MAGNETIC DISK WITH HIGH SP³ CONTENT

BACKGROUND OF THE INVENTION

This invention relates to a method of and apparatus for depositing amorphous carbon thin films that protect the magnetic media used in hard disk drives, to the media so formed, and to disk drives incorporating the media.

Metallic magnetic thin film disks used in memory applications typically comprise a substrate material that is coated with a magnetic alloy film that serves as the recording medium. Typically the recording medium used in such disks is a cobalt platinum-based alloy such as CoPtCr, CoPtCrTa, CoPtCrB, CoPtCrTaB or other various combinations of elements which is usually deposited by sputtering. The magnetic layer typically has an underlayer beneath it, consisting of Cr or Cr alloys, and also may have additional layers or seedlayers such as NiAl below the Cr layer. The substrates used for the deposited film are typically aluminum coated with plated NiP, or amorphous glass or glass ceramic materials.

Magnetic media is typically protected by a thin carbon overcoat film. An example of such a sputtered carbon overcoat is described by F. K. King in "Datapoint Thin Film Media", published in IEEE Transaction in Magnetics in July 1981, incorporated herein by reference. It is also known to provide a carbon film containing hydrogen by using hydrogen gas during sputtering as described in U.S. Pat. No. 5,045,165 by Yamashita. The protective overcoat is an extremely important component of thin film magnetic recording disks. When a disk drive is turned on or off, the recording head that normally flies over the recording surface comes into sliding contact with the media. Over the life of the disk drive, the head comes into many such "contact start-stop" with the media surface and the overcoat must protect the media from becoming destroyed in the process This is accomplished by providing a good wear resistant overcoat, and a thin layer of liquid lubricant that reduces the friction coefficient between the head and the media. Typically the media must withstand at least 20,000 cycles or more of repeated contact start-stop. It is also not unusual to have a specification of 100,000 contact start-stop capability for the disk and the disk drive.

Alternatively, the recording head can be pulled away from the disk surface when the drive is not in use or when it is turned off. In such drives, the contact start stop does not take place between the head and the disk surface. The designs that allow the head to be pulled to the side of the disk away from the disk surface are generally called ramp-loading mechanisms. However, the recording heads still fly very close to the media surface during operation of the drive, such that occasional contact occurs between the disk surface and the head. Therefore even in the drives using ramp-load mechanisms, the media must still have a protective overcoat.

As is known, magnetic films consisting of cobalt alloys are susceptible to corrosion during environmental extremes that the hard disk drives may see. The overcoat also protects the magnetic media from this corrosion. Today, the vast majority of the disks used for hard disk drives have sputtered carbon overcoat. Sputtering is a method of deposition whereby a target material to be deposited is "sputtered" or eroded by a plasma, and the plasma carries the sputtered species to the parts to be coated.

The thickness of carbon overcoat film has been steadily reduced over the years so that recording head can be made to fly closer to the magnetic media. As the active element in the head is placed closer to the magnetic layer, higher recording density can be achieved. Today, high performance hard disk drives have recording density in the range of 6–8 Gbits per square inch (about 1 Gbits per square centimeter). A media for such application has an overcoat thickness that is less than 10 nm thick and the recording heads fly at around 30 nm from the top of the carbon film. In order to increase the recording density even higher, there is a strong desire to reduce the carbon overcoat thickness further to 5 nm or even thinner, and also to reduce the flying height of the recording head below 25 nm. At the same time however, the media is expected to meet or exceed the reliability of current media having thicker carbon overcoat and higher flying heights. Typical measures of reliability are contact start stop capability and corrosion resistance. It has been very difficult to meet such expectations from a conventionally sputtered carbon overcoat as overcoat thickness is reduced below 10 nm.

A carbon film deposited by sputtering is amorphous. It has no evidence of crystallinity down to the resolution of the most powerful transmission electron microscopes. To enhance the properties of the sputtered carbon films in terms of contact start stop performance or corrosion resistance, additives such as hydrogen have been added to the film as described in U.S. Pat. No. 5,045,165. Alternatively nitrogen or a combination of nitrogen and hydrogen is also sometimes used to enhance contact start stop performance. The sputtering process typically involves applying DC power onto a graphite target. A type of sputtering cathode called DC magnetron cathodes are typically used. Depending upon the size and configuration of the cathode, typical voltages that develop on the target are between 300 to 800 volts negative DC with various current level to achieve the necessary deposition rate.

Alternatively, the DC power can be applied as a pulse, using power supplies available from companies such as Advanced Energy Industries, Inc. based in Fort Collins, Colo. for example. In such case the pulse rate can be fixed or adjustable to typically 20 kHz to 50 kHz range. Alternatively, an AC power supply can be used, or a combination of AC and DC power supply as described by Yamashita et al. in U.S. Pat. No. 5,507,930. Generally speaking, the carbon films sputtered by these methods have similar atomic structures. The carbon in these films have between 30 to 50% of their bonds in $sp^3$ bonding configuration depending upon the method of measurement that is used. The typical film stress for these films are around 1 to 2 giga-pascal (GPa) compressive for a film of around 10 nm thickness.

The vast amount of scientific work on carbon films in recent years has caused investigators to adopt common conventions to describe the film types based on their chemical structure. For amorphous carbon films, the following conventions are in general use:

| | |
|---|---|
| a-C | amorphous carbon |
| a-C:H | hydrogenated amorphous carbon |
| ta-C | tetrahedral amorphous carbon |
| ta-C:H | tetrahedral hydrogenated amorphous carbon |

The amorphous carbon film should be distinguished from actual diamond film which is composed of crystalline diamond and has a high $sp^3$ bonding fraction. Both sputtering and chemical vapor deposition methods such as plasma-enhanced chemical vapor deposition (PE-CVD) and ion-beam deposition produce largely amorphous carbon films. Hydrogen is almost always present to varying degree from the hydrocarbon gas used in the CVD type process, and in the case of sputtering, from deliberate introduction of hydrogen in the plasma. Amorphous carbon films containing a significant amount of hydrogen are categorized as "hydrogenated amorphous carbon films" and designated as a-C:H films.

The vast majority of sputtered carbon overcoat typically used in the magnetic media can be categorized as a-C:H type carbon film, due to incorporation of 20 to 40% atomic fraction of hydrogen in the film. A designation as an a-C or a-C:H carbon film also implies that the fraction of its bond in the $sp^3$ or tetrahedral bonding configuration is relatively low, typically from around 10 to 50%. It is known that hydrogen incorporation increases $sp^3$ content of sputtered carbon films to a maximum of around 50% by current knowledge.

In order to enhance the properties of the carbon films, various investigators have been recently focused on creating a new high $sp^3$ content amorphous film designated as ta-C or ta-C:H carbon film, which stands for tetrahedral amorphous carbon film, indicating a high fraction of bonding in the $sp^3$ state. In order to qualify as ta-C carbon, the $sp^3$ bonding fraction in the film should be at least 70% a n d preferably in the range of 80% or higher. Another term often used for the ta-C carbon is "DLC" or diamond-like carbon. However, the term "DLC-carbon" has been widely misused so that it may be best not to use this terminology for the amorphous carbon film. The main reason for the confusion in terminology for and description of the film has been the lack of clear measurement tools that definitively define the properties of the carbon film in the past. Currently, the situation has been greatly improved due to better understanding of the tools and the measurements themselves, and due to the application of new tools to enhance the understanding of the nature of the films.

ta-C or ta-C:H carbon films have superior mechanical and corrosion properties compared to the a-C:H carbon by virtue of the high $sp^3$ content. It is known to have higher compressive stress, which leads also to a higher hardness in the film. The density is also known to be higher than a-C or a-C:H film, although the density can vary as function of hydrogen content as well. For magnetic hard disk application, it is thought that ta-C:H carbon offers much better properties in terms of contact start-stop and corrosion resistance especially for films less than 10 nm in thickness. There is considerable desire to reduce the film thickness to around 5 nm currently, and even down to 2 nm in the near future. However, these thinner films must not lose any performance compared to current films. Since it is also believed that conventional sputtering method cannot create ta-C:H type carbon film, recent efforts to produce such carbon have focused on the use of PE-CVD or ion-beam deposition method.

PE-CVD and ion-beam depositions are fundamentally different methods of deposition compared to sputtering. The source of carbon in sputtering is typically a graphite target, while in PE-CVD and in ion-beam deposition, the source is hydrocarbon gasses. Both PE-CVD and ion-beam deposition can be categorized as forms of CVD, since both use hydrocarbon gas to create the carbon ions that are used to form the film. A more detailed description of the ion-beam method of forming the carbon film is described by Weiler et al. in "Preparation and Properties of Highly Tetrahedral Hydrogenated Amorphous Carbon" published in Physical Review B, January 1996. In a narrow range of deposition condition and energies of carbon ions, Weiler et al. report on fabricating ta-C:H film by their form of ion-beam deposition.

The benefits of ta-C:H carbon is described by Weiler et al. in the above mentioned article. The $sp^3$ bonding fraction in ta-C:H carbon is as high as 80%, and the film stress is much higher for a given thickness of the film compared to films with lower $sp^3$ content. Consequently the density and hardness of the film is highest at the highest $sp^3$ content. However, in PE-CVD or ion-beam deposition, the process must be tuned fairly precisely, to maintain the energy per carbon atom ion near 100 ev/atom for their method. Otherwise the $sp^3$ fraction drops precipitously on either side of the energy value. The films produced according to Weiler's prescription for ta-C:H carbon film may have several advantageous properties for hard disk application. At 5 nm film thickness for example, the film known to contain high $sp^3$ fraction made by ion-beam and PE-CVD method continues to exhibit good contact start-stop performance and corrosion resistance, while conventionally sputtered a-C:H films starts to show a deterioration in performance.

Both PE-CVD and ion-beam deposition methods have one common drawback, which is that they create a tremendous amount of flaking and particles during deposition compared to sputtering. The hard disk media must be maintained extremely clean. Even a presence of small amount of particles that can be trapped between the disk and the head can cause catastrophic head crashes since the head flies very close to the surface. This difficulty has prevented more widespread use of PE-CVD and ion-beam deposition in hard disk manufacturing. In deposition applications that require only intermittent use of the tool such as in semiconductor and recording head manufacturing, both PE-CVD and ion-beam methods have found more widespread use. In hard disk manufacturing however, the manufacturing tool must run continuously for at least 5 days or more in order for it to be economical. For example, the in-line sputtering systems as described in U.S. Pat. No. 5,045,165 by Yamashita can run continuously for 4 weeks without opening the system for servicing. It has been difficult to obtain even a few days of continuous deposition out of the CVD or ion-beam deposition tools due to particle generation during deposition. Such short utilization severely impacts the productivity of the expensive deposition tools, and increases the cost of manufacturing. In addition, the cathodes used for PE-CVD and ion-beam deposition are also expensive compared to comparable sputtering cathodes.

In some implementations of PE-CVD and ion-beam deposition methods, substrate bias is required in order to obtain the ta-C:H type carbon films. It is more advantageous to have a process which does not require substrate bias since some substrates that are used for hard disk application are insulators, such as glass and glass ceramics. It is necessary to have conductive substrates in order to apply substrate bias to the disk. For ion-beam deposition, many cathode designs have problems that impact their usefulness in continuous deposition tools. In some designs, a hot filament is needed in front of the cathode as source of electrons to energize the plasma. The filament can burn out and can be coated with the film of the material to be coated and cause significant reduction in the amount of time that the cathode can be operated. In other designs, the potential that is needed to extract the beam of carbon ions is applied through a thin grid placed in front of the gun. These grids wear out due to bombardment by the ions, or else are coated by the film to be deposited, and therefore must be periodically replaced. The grid also contributes significantly to particle generation as it is rapidly coated during the deposition and begins to flake.

Finally further difficulties involved in PE-CVD or ion-beam deposition methods is that they require hydrocarbon gasses as source of carbon ions. Typical gases are acetylene, ethylene, naphthalene and butane. These gases are hazardous and require special precautions. Special handling and safety requirements must be rigorously followed for safe operation. Typically, large capital investments are needed to meet regulatory requirements. Related to the use of hydrocarbon gas is that film uniformity is often difficult to achieve in PE-CVD and ion-beam deposition. The film uniformity depends sensitively on hydrocarbon gas uniformity within the cathode, which is often difficult to control. Although the uniformity is in principle controllable, it has been more difficult compared to the conventional sputtering method, which is more established.

Manufacturing of hard disk media is typically done in two different type of machines. The first is called "in-line" deposition tool, and it is described in U.S. Pat. No. 5,045,165 by Yamashita. In such a tool, the disks are loaded on large pallets which pass by series of cathodes which deposit the films successively on a disk. Alternatively, the disk can be deposited one disk at a time using circular targets or cathodes using a machine tool generally called a "static" deposition tool. Such machines are manufactured by Intevac Inc. of Santa Clara, Calif., Balzers Process Systems, Inc. of Alzenau, Germany and Anelva Corporation of Fuchu-shi, Japan.

To increase productivity and reduce the cost of manufacturing, it is important to operate the sputtering machine continuously with high utilization. There are several factors which limit the continuous operation of the sputter machines. First, the target can be used up, and the system must be opened to replace it. Second, the protective shields that direct the sputtered species to the substrate become coated, and they will eventually start to flake. The shields must be periodically replaced and cleaned. Excessive flaking from the shields contributes to increased defects on the disk surface.

A third factor that is specific to carbon sputtering is that the carbon target has finite run times due to formation of defects on the target surface, which are generally called "nodules," "warts" or "mushrooms" which degrade the performance of the cathode. Formation of these defects on the target surface contributes to an increased rate of arcing on the target. Arcs cause defects and particles to be deposited on to the disk surface. An increasing rate of these defects can cause premature shut-down of the system. During a shut down, the sputtering system is vented to air and the targets are cleaned or replaced. The time needed to do the maintenance and target changes contributes to a loss of utilization and adds cost to manufacturing. Typically the sputter line is the most expensive capital equipment needed in making the disks, therefore a loss in utilization impacts seriously the overall cost of manufacturing.

A method described by Yamashita et al. in U.S. Pat. No. 5,507,930 teaches one method of reducing nodules on the carbon target surface by use of AC power superimposed on DC which also reduces arcing. Even with such methods however, the carbon target is still susceptible to nodule formation and excessive arcing. Therefore conventional sputtering is still far from being ideal, but it is still more suitable for manufacturing than PE-CVD and ion-beam deposition methods. An additional method to reduce nodule formation has been to use a pulsed DC power supply which provides a square wave type positive voltage pulse at a frequency of 20 kHz for a duration (pulse width) of several micro-seconds ($\mu$-seconds).

SUMMARY OF THE INVENTION

We have discovered a method of creating a ta-C or ta-C:H carbon film with high $sp^3$ content by a simple and inexpensive modification to the basic sputtering method. A carbon film that is nearly indistinguishable from the ta-C:H carbon films produced by PE-CVD or ion-beam deposition in terms of properties and performance is created by this method. The present invention takes advantage of the long run capability that exists already with sputtering method. In fact, the new sputtering method can even increase the productivity of the deposition tool over the conventional sputtering process. In addition, the new method is actually cleaner in terms of particle generation and the target surface remains very clean during deposition, leading to improved process yields and increased cleanliness of the disk after sputter, compared to conventional sputtering process. This eliminates the necessity of using more complex and expensive PE-CVD or ion-beam deposition method to create the same ta-C or ta-C:H carbon film.

In order to create the ta-C:H carbon film by sputtering, a special type of pulsed DC power supply is used. The special pulsed power supply is capable of providing high voltage spikes or deviations, and hence provide a very high energy pulse to the plasma. Power supplies with such characteristics are manufactured by ENI Inc. of Rochester New York and by Advanced Energy Inc. of Fort Collins, Colo. When these special types of power supplies are used in conjunction with sputtering of carbon target under operating conditions and process conditions such as those described herein, the properties of the sputtered carbon films change from conventional a-C:H type with low $sp^3$ bond fraction to ta-C:H type carbon with high $sp^3$ bond fraction. The pulsed DC power supply can provide adjustable pulse frequency typically 50 kHz to around 200 kHz. The range of available frequencies can be used to produce the ta-C:H type carbon film as long as certain pulse characteristics described herein are met. When a pulsed power is applied to carbon target, the pulse rate and duty cycle of the pulse can be adjusted to obtain a unique voltage and current profile that has not previously been possible with conventional power supplies.

A particular set of pulse characteristics that creates a ta-C:H type carbon film is described as follows: First the power supply delivers a positive potential to the target, by as much as, e.g. 300 volts positive. In this condition, the Argon ions used for deposition is actually repelled away from the target so that no sputtering takes place. Little current flows to the target in the positive swing in voltage and the power supply act as voltage source. Then, the power supply switches and applies a negative potential to the target. The power supply under this condition acts essentially as a current supply which applies whatever voltage necessary to obtain a preset current level. The net effect for the carbon target is that large voltage is imparted to the target momentarily to overcome the positive voltage that had just been applied. The negative voltage can be two or three times higher than the steady state negative voltage. The large negative swing in the applied potential to the target momentarily causes a high deposition rate and carbon atoms can have much higher energy than in normal sputtering. The high rate is not maintained continuously since the voltage spike is only momentary. The pulse duty cycle is adjusted so that average deposition rate differs little from continuous DC sputtering mode.

In addition to the pulsed DC sputtering with above mentioned characteristics, the substrate can also be biased in order to enhance the ta-C:H characteristics of the carbon film. Although this can only be done with conductive substrates, the effect is pronounced and useful. Nominally the substrate is biased negative to the ground, so that there is potential of additional bombardment of the substrate by the argon ion used to sputter the target or to accelerate the carbon ions that may have formed during sputtering at high target bias potential. When substrate bias is applied, the positive ions will be accelerated toward the substrate during deposition. With nominal substrate bias of only, for example, approximately 50 volts negative, the film property can be adjusted to a higher fraction of $sp^3$ bonding. It is noteworthy that in conventional sputtering process using flat DC potential applied to the target, or pulsed DC potential without the large momentary negative voltage described above, there is little effect on the carbon properties as result of substrate biasing. Only under this pulsed DC sputtering is there a pronounced effect of substrate bias on the atomic bonding structure of the film.

The substrate temperature is also an additional variable that affects the $sp^3$ content of the film under this new sputtering method. With a small adjustment of the temperature of the substrate during sputtering, the $sp^3$ content can be adjusted up or down. Temperatures in the range of around 80 to 150° C. are within the preferred operating region of this process. For example, adjustment of substrate temperature during the carbon deposition by only 10 to 20° C. can be used to adjust the $sp^3$ content and the stress of the film by a significant amount. Again, this adjustability of $sp^3$ content and stress by temperature is not available or seen in conventional sputtering methods. Only in this new pulse sputtering method, is a pronounced effect observed. The adjustability of $sp^3$ content and film stress is an important parameter since there are some adjustments that may be of advantage in tuning the properties of the overcoat around specific drive environment and the type of heads used. Although it may appear to be advantageous to keep increasing $sp^3$ content, there comes with it a higher film stress. Too high a film stress can cause delamination and other mechanical problems, therefore there is a trade-off between having the good properties of the high $sp^3$ content and the detrimental effect of too high a stress.

The ability to create ta-C:H type carbon with high $sp^3$ content by the above modification to the conventional sputtering method is completely unexpected. In addition, that some deposition variables such as substrate bias and deposition temperature now influence the $sp^3$ content of the film is also unexpected. The ability to use these parameters to effect change in such critical carbon properties was not previously available with conventional sputtering methods. The pulsed DC power supplies as described herein are originally intended to maintain arc-free deposition of materials that tends to form highly insulating films. They are also promoted as maintaining a much cleaner target surface compared to conventional DC sputtering methods. Such characteristics are actually delivered by the use of pulsed DC sputtering of carbon and hence it is an added benefit for the sputtering of carbon films.

BRIEF DESCRIPTION OF THE DRAWINGS

FIG. 1 shows schematic cross section of a typical construction of the thin film media.

FIG. 2 shows schematically the voltage and current waveform at 50 kHz frequency as produced by the pulsed DC power supply for creating the ta-C:H carbon film according to an embodiment of the present invention.

FIG. 3 is a schematic diagram of the waveform as produced by a conventional pulsed DC power supply without the voltage spikes FIGS. 4A–4C are schematic diagrams of the pulsed waveform as a function of different duty cycles of the pulsed DC power supply showing the changes in negative voltage spike as function of the amount of time the positive swing is applied to the target.

FIGS. 5A–5I show schematically the typical voltage and current waveforms at different frequencies from 50 to 250 kHz as produced by the pulsed DC power supply for creating a ta-C:H carbon film according to an embodiment of the present invention.

FIG. 6 shows reflection energy loss spectrum of a conventionally sputtered carbon, a carbon film prepared by PE-CVD method, and a film prepared by an embodiment of the present invention.

FIG. 7 is a plot of stress vs. thickness for different carbon film thickness for a conventionally sputtered carbon film, an ion-beam deposited carbon film and a film prepared according to an embodiment of the present invention.

FIG. 8 is a plot of Ig/Id ratio from Raman spectrum comparing a ta-C:H carbon film deposited by an embodiment of the present invention, an ion-beam deposited ta-C:H carbon film and an a-C:H film made by a conventional DC sputtering method.

FIG. 9 is a comparison of the ion-chromatograph extraction values of cobalt obtained from media with a ta-C:H carbon film obtained by an embodiment of the present invention, an ion-beam deposited carbon film and a conventionally sputtered carbon film, all with 5 nm thickness.

FIG. 10 is a photograph of the carbon target surface after 2 weeks of continuous conventional DC sputtering.

FIG. 11 is a photograph of the carbon target surface after 2 weeks of continuous sputtering using an embodiment of the present invention.

FIG. 12 is a plot of stress vs. applied substrate bias for a ta-C:H carbon made according an embodiment of the present invention.

DETAILED DESCRIPTION

Methods of and apparatus for making a carbon film, magnetic recording media using the carbon film, and storage devices incorporating the media are disclosed. In the following description, numerous specific details are set forth such as specific materials, layers, operating parameters, processes, physical characteristics, etc. It will be appreciated, however, that these specific details need not be employed to practice the present invention. In other instances, well known methods and apparatuses are not described in detail in order not to obscure unnecessarily the present invention.

FIG. 1 is a schematic diagram of a typical hard disk media 100 made according to the current invention. The substrate 101 is typically a 95 mm, 84 mm or 65 mm diameter disk made of NiP plated aluminum or amorphous glass or glass ceramic. The substrate is polished to a mirror like smoothness upon which various layers are sputtered successively above it. The first layer is typically chromium or a chromium alloy layer 102, followed by a magnetic layer 103 consisting of cobalt, platinum and a combination of various additives such as chromium, tantalum, niobium, boron and other additive elements. The carbon layer 104 is the final vacuum deposited layer and it is typically sputtered. Currently, the typical thickness of the chromium or chromium alloy layer 102 is between 5 to 30 nm, the magnetic layer 103 thickness is between 20 to 40 nm, and the carbon layer 104 thickness is typically 10 nm or less. It is usual to also apply a thin 1 to 2 nm thick liquid lubricant on top of the carbon film (not shown). The lubricant is applied after the film deposition. Other variants of the above structure include additional seed layer(s) beneath the chromium, such as NiAl. The magnetic layer 103 can be two or more different layers and the carbon film 104 can be composed of two different carbon films for example. The present invention is focused on formation of carbon films for use in media such as that illustrated in FIG. 1.

FIG. 2 shows voltage and current waveforms of the output of the RPG model pulse power supply made by ENI Inc. of Rochester, N.Y. at a frequency of 50 kHz supplied to a graphite carbon target. The system used for the data was obtained from a large in-line sputtering system manufactured by Ulvac Inc. of Japan. The carbon target size was 23 cm×62 cm. The sputter pressure was approximately 2.5 m Torr, with Ar gas flow of approximately 45 sccm and $H_2$ gas flow of approximately 20 sccm. In a preferred embodiment, the Ar and $H_2$ are combined and then introduced via tubes containing nozzles disposed proximate the target. In the embodiments of the present invention, the DC power is pulsed. In general, each pulse comprises an "on" time during which sputtering is occurring and an "off" time, during which little or no sputtering is occurring. The frequency refers to the number of on/off cycles per second. "Pulse length" refers to the duration of each pulse (i.e., the inverse of frequency), and "pulse width" in the present description refers to the duration of the off cycle. Generally, during the off cycle, zero voltage, or more commonly some positive voltage is applied to the target and little or no current flows through the system. The "duty cycle" generally refers to the percentage of time of the "on" portion of the cycle—i.e. in the present case the time during which the voltage is negative and sputtering occurs.

During the on portion of the target, negative voltage is applied to the target via the cathode. A current flows through the system and sputtering takes place. As will be described in more detail, the present invention comprises use of a pulsed DC power supply that provides a spike or peak negative voltage for a short period of time during each cycle that is greater in magnitude relative to a relatively constant or steady state voltage during the remainder of the on portion of the cycle.

Referring to FIG. 2, in one embodiment, the voltage as shown by trace 200 initially has a positive peak 201 of around 450 volts, which then settles to around 150 volts positive for a period of about 2 $\mu$-seconds. Then a large negative potential is applied as the power supply attempts to power up the target. The large, initial negative potential (negative peak 202) is around 1000 volts in this embodiment. Then the voltage settles down to around 600 volts negative and maintains a level or steady state voltage 203 until the power is cut off and the positive swing starts all over again. With a frequency of 50 kHz, each cycle is 20 $\mu$-seconds in duration. As will be discussed in more detail below, the amplitude of the large negative voltage swing is roughly proportional to the pulse width. Therefore the amount of negative potential spike that the target receives can be adjusted to obtain the desired properties in the film.

The corresponding current waveform 210 is superimposed in FIG. 2 below the voltage curve. It shows that there are large current fluctuations 211 as power is cut-off when the power supply delivers 450 volts positive to the target. During the large negative 1000 volts swing however, the current to the target is maintained steadily at roughly around 4 amps. It will be appreciated that these characteristic behaviors of the waveform are not only a function of the power supply itself, but also depend on the material being sputtered, the cathode design and also to the process conditions inside the vacuum chamber. One of skill in the art will understand that adjustments are necessary to the power supply settings (e.g. frequency, pulse width and power) as well as to the process (e.g. gas composition and pressure) in order to obtain the waveforms that are shown in FIG. 2 and other embodiments of the present invention.

The above waveform delivered by the ENI's RPG model DC power supply is in stark contrast to the standard DC power supply which provides only a steady negative potential. A typical value for the target of above example is around 550 volts negative potential to obtain the same sputter rate as in the above example. Alternatively, there are also power supplies which provide a square wave pulse of power, without the large swings in voltage. FIG. 3 shows a waveform of pulsed power supply made by Advanced Energy Inc, using their Spark-le V model. The pulse rate is 50 kHz and the pulse width is 2 $\mu$-seconds which are the same as in FIG. 2. For the voltage trace 300 on top, the voltage swings to around 300 volts positive (positive peak 301) when the power supply is turned off. This is somewhat similar to the response of the ENI's RPG power supply, although the initial positive voltage spike and corresponding ringing in current amplitude is less than that of the power supply used in FIG. 2. When the power is turned on again however, the voltage slowly approach 600 volts negative without the large negative deviation as seen in ENI's RPG power supply. It is believed that this difference is crucial in the type of carbon film that can be obtained. In addition, it is believed that the initial large positive voltage spike 201 at the beginning of the on cycle may play an important role, either alone or in combination with the negative voltage swing 202, in determining the properties of the carbon film.

As mentioned above, the magnitude of the large negative voltage spike 202 is a function of the pulse width (or viewed alternatively, a function of the duty cycle) of the power supply. FIGS. 4A–4C show the effect on pulse waveform of setting up the power supply so that the power supply is on positive potential for different amounts of time. In FIG. 4A the pulse width is 2 $\mu$-seconds, in FIG. 4B the pulse width is 4 $\mu$-seconds, and in FIG. 4C the pulse width is 8 $\mu$-seconds. As the width of the positive swing is increased, it can be seen that negative voltage spike increases from around −1000 volts to over −1200 volts. Such response is target and cathode dependent, so that although the same response qualitatively can be expected for other target and cathode configurations, the magnitude of the voltages (both the positive and the negative spikes and steady state values) may be different than those shown. As described previously, one of skill in the art can adjust both the power supply and the process parameters to achieve the desired waveform. The magnitude of the negative voltage spike affects the deposited carbon film. It has been found that a lower magnitude negative voltage spike results in films with less $sp^3$ content, and conversely a greater magnitude spike results in a greater $sp^3$ content. While a greater pulse width leads to a greater negative voltage spike, it also results in a reduced duty cycle meaning that an embodiment such as that shown in FIG. 4C will have a lower sputter rate than the embodiment of FIG. 4A.

The pulsed power supply with the high voltage swings such as the ENI's RPG model can be also set up to run at different frequencies. For example the power supply can be set up to run at frequencies higher than 50 kHz. FIGS. 5A–5I are a series of graphs showing the effect on pulse waveform as a function of pulse frequency from 50 to 250 kHz, as indicated in the Figures. The width of the positive swing has been kept constant at around 2 $\mu$-seconds in each case. It can be seen that in this set up, the value of the negative voltage spike remains roughly the same across all the frequency ranges. The duty cycle can be adjusted as shown in FIGS. 4A–4C as long as there is enough time to fit the length of the pulse within the frequency value that was chosen. As can be seen, the power supply can be set up in different configurations for which the characteristics as described in FIG. 2 can be obtained. As also can be seen, as the frequency increases the negative voltage spike makes up a larger and larger portion of the off cycle. At relatively high frequencies above approximately 175 kHz or so, the steady state portion of the on cycle begins to disappear. Nevertheless, as can be seen a large spike exists which is greater in magnitude than the average voltage during the on cycle.

To form a carbon film with ta-C:H characteristics according to the present invention, the films were sputtered using the above-described RPG pulsed power supply from ENI in an in-line deposition tool manufactured by Ulvac Inc. of Japan. The disks were 95 mm diameter and 0.8 mm thick aluminum plated with NiP. 15 nm of Cr alloy underlayer was coated, followed by 15 nm thick CoCrTaPt magnetic layer. The carbon was sputtered at different power settings ranging from 2.0 KWatts to 4.0 KWatts to obtain film thickness that range from 5 to 10 nm in thickness. An argon flow of 45 sccm and hydrogen flow of approximately 20 sccm was used during sputtering. The pressure was maintained at approximately 2.5 milli-Torr during sputtering. The carbon target dimension was 23×62 cm. The approximate deposition rate for above thickness range is between 0.13 to 0.26 nm/second. The power supply was set to 50 kHz for a pulse length of 20 $\mu$-seconds. The positive voltage swing duration (pulse width) was set to 2 $\mu$-seconds. Pallets carrying the disks were moving by the carbon target at around 40 cm per minute. The carbon target was a conventional graphite target as is available from many sources. It will be appreciated that the above parameters, including power supply parameters, and process parameters may be varied and that the foregoing are merely exemplary. Additionally, in embodiments where it is desired to form a hydrogenated film, either hydrogen or hydrogen containing gases such as ethylene, acetylene, butane, naphthalene and others may be used.

FIG. 6 is a data obtained from reflection energy loss spectrometer (REELS) for carbon films made by three different deposition methods. For a description of a REELS technique, see "Structure and Properties of Sputtered Carbon Overcoats on Rigid Magnetic Media Disks" by Hsiao-chu Tsai et al. in Journal of Vacuum Science and Technology, A6(4), July/August 1988. Each of the carbon films had a thickness of 5 nm. The first film, shown by trace 601, is a conventionally sputtered carbon film, the second film, shown by trace 602, is a PE-CVD film and the third film, shown by trace 603, is a film sputtered according to the method of the present invention described above. The ion beam deposited film was made by a decomposition of acetylene gas in the ion beam plasma, in a known process to create a film with a high fraction of $sp^3$ content. Reflection electron energy loss spectroscopy is an well-accepted spectroscopy method which can probe the chemical bonding structure of materials. It is particularly well suited for the analysis of carbon films for determining the nature of the bonding present between the atoms, and also can provide an estimate of the fraction of the bonding that is $sp^3$. For reference, the plot also shows the spectra for graphite (trace 604) to illustrate what the spectra for an sp2 material looks like. The figure shows that a conventionally sputtered film is set apart from the other two, and that a PE-CVD film and a film made according to the above-described embodiment have very similar characteristics. Analysis of the spectrum by known methods indicates that conventionally sputtered film has 50% $sp^3$ bonding, while the PE-CVD film has 70% $sp^3$ and the film made by the present invention has 72% $sp^3$ content. The high value of $sp^3$ content is a good indicator of formation of ta-C:H type of film by the new sputtering method.

A second indicator of ta-C:H character of a carbon film is the film stress. Film stress is measured by measuring the deflection of the actual disk material as result of depositing the film in question on only one side. The disk is pre-measured for flatness and after deposition on one side, the disk deflects in response to the stress of the film. By measuring the deflection using a sensitive optical tool, film stress can be determined. It is known from scientific studies on carbon films that film stress is well-correlated to the $sp^3$ content of the film. Higher $sp^3$ content film has higher stress for a given thickness of film.

FIG. 7 shows a comparison of three different types of films for film stress as function of film thickness. In FIG. 7, the comparison is between a conventional DC sputtered carbon film (trace 701), an ion-beam deposited film that is known to have high $sp^3$ content (trace 702), and a pulse sputtered carbon film made according to the present invention (trace 703). As a function of thickness, both ion-beam and the invented sputtered film have similar characteristics with film thickness, namely the stress level rapidly increase as film thickness is reduced, so that by 3 nm thickness for example, both ion-beam and film sputtered by new method has substantially higher stress compared to conventionally sputtered carbon film. This result is again indicative of high $sp^3$ content in the film and shows that films deposited by the method of the present invention are equal to if not superior to ion-beam deposited carbon films.

FIG. 8 is a comparison of Raman spectroscopy analysis of Id/Ig ratio of three types of carbon films at 4 nm thickness. Raman spectroscopy is a conventionally accepted means of analyzing the chemistry of carbon films. For reference, see "Characterization of Diamond Films by Raman Spectroscopy" by D. Knight et al. in Journal of Materials Research, Vol. 4, No. 2, March/April 1989. For amorphous carbon films, the Raman spectrum is characterized by broad absorption peaks that are roughly centered on two wavelengths. The peaks are identified as "d" and "g" peaks, and it is known that the ratio of these intensities are indirect indicator of $sp^3$ content in the film. U.S. Pat. No. 5,045,165 by Yamashita describes Raman analysis and results for hydrogenated amorphous carbon films. The plot of FIG. 8 shows that conventionally sputtered carbon 801 has a higher Ig/Id ratio of 0.8 which stands apart from the other two carbon films, which are the ion beam film 802 and the pulse sputtered film 803 according to the present invention. Again, it can be seen that the film property according to Raman spectroscopy is similar between the ion-beam deposited carbon film and the film prepared according to the present invention.

Another indicator of the characteristics of a carbon film is its ability to protect the disk from corrosion. One way to measure such property of the film is to conduct ion extraction from the disk surface. This is accomplished by first exposing a disk to high temperature and humidity for some period of time to attempt to cause corrosion of the cobalt containing magnetic layer. For example, the disk may be exposed to a temperature of 60° C. at 80% relative humidity for 96 hours. If some amount of corrosion occurs, the cobalt is known to migrate to the surface of the disk as it oxidizes and form cobalt oxide corrosion by-product. This is an extremely sensitive measure of the corrosion susceptibility of the media. This cobalt is then washed off by water, and the water is analyzed for presence of cobalt ions using ion chromatography. The method is extremely sensitive, which allows detection of only a few micro-grams of ions per given square meter of surface analyzed. If the overcoat has less ability to protect the film from corrosion, a greater amount of cobalt leaches out during the high temperature and humidity exposure.

FIG. 9 shows the result of ion-extraction results for three types of carbon films, at 5 mm thickness on a 95 mm media. It shows that ion beam carbon 902 has extractable cobalt of less than 1 μg/m2, conventional DC sputtered carbon 901 has extractable cobalt of around 5 μg/m2 and pulse sputtered carbon 903 according to the present invention has extractable cobalt of around 1.5 μg/m2. The corrosion resistance of the present invention may be considered equivalent to the ion beam carbon given the variability in the measurement, and it is clearly set apart from the conventionally sputtered carbon film. The values obtained for both ion beam and pulse sputtered carbon films are considered extremely low in comparison to the values typically obtained for conventionally sputtered films. A film deposited according to the present invention clearly has considerable advantage over the conventionally sputtered carbon due to a greater ability to protect the magnetic layer from corrosion.

The carbon films were also tested by an abrasive wear test to determine the relative durability of the overcoat. The test consists of passing abrasive tape over the disk for a fixed length of time, followed by an optical intensity scan to determine the amount of damage inflicted on the disk. The measurement is a relative measure and designed to reflect the mechanical durability of the film to intense abrasive wear condition. A lower value is better. Table 1 shows a tabulation of several types of films tested. Of note is the comparison between the pulse sputtered carbon at 8 nm against conventionally sputtered carbon at 10 and 11.5 nm thickness. The pulse sputtered carbon has a result which is comparable to thicker carbon film indicating an improvement in wear resistance compared to the conventionally sputtered film.

TABLE 1

| Sample Type | Carbon thickness | Scratch Level |
|---|---|---|
| Conventional Sputter | 11.5 nm | 40 |
| Conventional Sputter | 10 nm | 48 |
| Pulse Sputtered (50 kHz) | 8 nm | 48 |
| Pulse Sputtered (124 kHz) | 8 nm | 40 |

Contact start stop tests were also performed on the carbon films made according to this method. A set of disks with 3 nm thick overcoat were tested to 30,000 contact start stop test using a conventional test setup for doing such tests. 4 drives out 4 completed the test without failure and with little increase in the start-up friction level. Normally the same test performed on conventionally sputtered carbon films will fail within several thousand contact start stop cycles more than half of the time. It is clear that the contact start stop performance is superior for the carbon films made according to the present invention.

In summary, the above described measurements show that a carbon film sputtered according to the method described herein creates a sputtered carbon film that is indistinguishable from ion-beam and PE-CVD deposited carbon films of similar thickness. This is an entirely unexpected result based on what is conventionally known of the sputtering process in general. It has been believed that only the PE-CVD and ion-beam deposition method provides sufficient energy to the deposition, namely the formation of large amount of positively charged carbon ions which allows the formation of true so-called "ta-C:H carbon" film with a high fraction of $sp^3$ bonding. It has been thought that the sputtering method does not create carbon ions in sufficient quantities or with the right energy to create a ta-C:H carbon film. The results provide that this is clearly not the case and that films with properties indistinguishable from PE-CVD and ion-beam deposition can be fabricated by the sputtering method. This is an considerable advantage, since sputtering is much more inexpensive and well-established method for making carbon films in hard disk manufacturing. The process is much cleaner than CVD and ion-beam deposition method, and the process can be run over long run times which provides higher productivity from the deposition tools.

A further benefit of the pulse sputtering method is that the target surface after extended run is much cleaner than by conventional sputtering method. FIG. 10 shows a photograph of the DC magnetron target used in the Ulvac in-line tool after two weeks of continuous operation using conventional DC magnetron sputtering. The target surface is full of nodules which have been described in U.S. Pat. No. 5,507,930. These features are associated with formation of defects on the disk, and also with the formation of particulates during deposition. FIG. 11 shows the same cathode after 2 weeks of deposition using pulse sputtering at 50 kHz. The target surface is remarkably clean compared to FIG. 10. This method then is clearly superior to any PE-CVD or ion-beam deposition method in terms of cleanliness of the process. Yield and quality of the disk is expected to be like-wise superior compared to conventional sputter process.

In further variants of the present invention, the properties of the pulse sputtered film can be further enhanced and controlled through application of negative substrate bias during the pulse sputtering. Trace 1201 of FIG. 12 shows the results of different substrate bias on the stress of the 5 nm thick carbon films, deposited with heating such that the substrate temperature was approximately 98° C. during sputtering. From approximately 30 to 100 volts negative substrate bias, the film stress can be raised from around 3.2 Gpa to 4.5 Gpa. This is a significant increase over the unbiased condition. It is expected that the atomic property of the film is likewise changing to a higher $sp^3$ fraction by application of such bias. The bias can be applied with steady DC bias, or the same pulsed power supply can be used for substrate bias as well. Any desired bias may be used. In preferred embodiments, the bias may range from, e.g., the voltage that builds up on the substrate when it is allowed to float, to approximately 200 volts negative. For comparison, data point 1202 shows the stress of a 4 nm ion beam film deposited at a temperature of approximately 150° C. in the earlier described system from Intevac.

Adjustment of substrate temperature by a small amount at the time of pulse sputtering can also impact the film stress. For example, if the temperature is raised from 97 to 115° C., the film stress can be changed from 3.2 Gpa to about 6.8 Gpa without changing any other parameters. This result is also indicated in FIG. 12 by line 1205.

As described herein, variables available to adjust the properties of the carbon film include settings used for the pulse power supply (e.g. frequency, power and pulse width), the sputter deposition conditions such as pressure, gas composition and flow rate(s), substrate bias conditions and the substrate temperature. The parameters can be adjusted to optimize the carbon films for proper level of $sp^3$ bonding for optimum contact start stop, or corrosion resistance or other measure of durability as desired for different drive applications. Thus, the method of the present invention provides an improved magnetic recording disk, which can be used to produce an improved disk drive. The disk drive may have one ore more of improved CSS performance, corrosion resistance, durability and defect levels.

Although not wishing to be bound by theory, it is believed that the large negative voltage spike produced by the power supplies described earlier provides for sufficiently high energy carbon or carbon ions such that a high percentage of $sp^3$ bonding is formed. It is also believed that the increased positive voltage spike at the beginning of the off pulse may account for the improvement of the present invention, either alone or in combination with the negative spike. In general, with respect to the negative spike, it is believed that any spike in voltage greater than the steady state value is helpful. Typically, the spike is approximately 25% greater than the steady state voltage, and more preferably approximately 50% or more greater than the steady state voltage. As shown herein, embodiments of the present invention where the spike is approximately 100% or more greater than the steady state voltage are advantageous. In some embodiments, such as those having a sufficiently high frequency and long pulse width, a true steady state negative voltage may not be reached. Nevertheless, in such embodiments it is believed that a large spike that is greater than the average voltage during the on cycle by approximately the foregoing amounts is beneficial. If desired, known adjustments can be made to the system to increase the voltage levels. For example, as is known, a weaker magnetic field results in an increased voltage for a given current.

Moreover, it is believed that the high magnitude of the voltage spike is beneficial. In this regard, it will be noted that the negative voltage spike in embodiments of the present invention typically is approximately 900 volts–1,000 volts or more. This is much greater than the voltage typically used in conventional DC or conventional pulsed DC sputtering processes. In general, the steady state negative voltage during the on cycle of a pulsed process is slightly greater than the DC voltage of a continuous DC process having the same sputter rate due to the off portion of the cycle. In the present invention, the effect of the off cycle is somewhat reduced by virtue of the fact that a greater amount of sputtering occurs during the negative voltage spike. However, it is believed that the presence of a spike in the range of approximately 900 volts or more, or in relative terms 50% greater and more preferably 100% or more greater than the voltage in a continuous DC process or the steady state voltage in a conventional pulsed DC process having the same sputter rate, is beneficial. With respect to voltages, it will be appreciated that the target and the substrate are usually referenced to ground, and in most systems the chamber walls are grounded. One of skill in the art will readily understand that the sputtering is typically driven by the voltage difference between the target and the substrate, so that, for example, a negative voltage as used herein does not necessarily mean as referenced to ground, but may be instead the magnitude as referenced to the substrate, for example.

While the invention has been described with respect to specific embodiments thereof, those skilled in the art will recognize that changes can be made in form and detail without departing from the spirit and scope of the invention. Although specific embodiments have been shown, aspects of any embodiment can be used in others. The embodiments described herein, as well as embodiments having changes in form and detail as may be readily apparent to one of skill in the art upon reading the present disclosure are understood to come within the scope of the present invention.

What is claimed is:

1. A method of depositing a carbon film comprising:
    sputtering from a target onto a substrate, said target comprising carbon, said sputtering comprising:
        applying a voltage to said target, said voltage applied by a power supply in a pulsed mode, the pulse comprising at least a first portion and a second portion, the voltage applied during said second portion more negative than that applied during said first portion;
        wherein a first sub-portion of said second portion is more negative than a steady state voltage of said second portion.

2. The method as described in claim 1 wherein said first sub-portion of said second portion occurs when said voltage switches from said first portion to said second portion.

3. The method as described in claim 2 wherein said power supply acts as a current supply when said voltage switches from said first portion to said second portion, thereby driving said voltage to the said greater negative value during said first sub-portion of said second portion.

4. The method as described in claim 1 wherein said first portion further comprises a positive voltage spike at the beginning of said first portion.

5. The method as described in claim 1 wherein said first sub-portion of said second portion is approximately 50% or more greater in magnitude than a continuous voltage applied in a continuous DC sputter process having the same sputter rate.

6. The method as described in claim 1 wherein said sputtering is performed in the presence of a hydrogen-containing gas.

7. The method as described in claim 6 wherein said hydrogen-containing gas is one or more gas selected from the group consisting of hydrogen, ethylene, acetylene, butane, and naphthalene.

8. The method as described in claim 1 wherein an $sp^3$ content of the film as measured by reflection electron energy loss spectroscopy is approximately 70% or more.

9. The method as described in claim 1 wherein said power supply operates at a pulse frequency in the range of approximately 50–175 kHz.

10. The method as described in claim 1 wherein the pulse width is in the range of approximately 1–10 $\mu$-seconds.

11. The method as described in claim 1 wherein the substrate is biased during sputtering with respect to ground.

12. The method as described in claim 11 wherein the bias is applied at a voltage of 200V negative or less.

13. The method as described in claim 1 wherein said carbon film is formed to a thickness of 10 nm or less.

14. The method as described in claim 1 wherein said carbon film is formed to a thickness of 5 nm or less.

15. The method as described in claim 1 further comprising forming said carbon film as a protective layer of a magnetic recording disk.

16. The method as described in claim 1 wherein said first sub-portion of said second portion comprises a negative voltage spike.

17. A method of depositing a carbon film comprising:
    sputtering from a target comprising carbon onto a substrate, wherein power is supplied to said target by a pulsed power supply, said pulsed power supply applying a negative voltage for at least a portion of a pulse, said portion further comprising a first value and a steady state voltage achieved during said portion of said pulse, said first value 25% or more greater in magnitude than said steady state value.

18. The method as described in claim 17 wherein said first value comprises a spike at the beginning of the portion of the pulse where the negative voltage is applied.

19. The method as described in claim 17 wherein said power supply acts as a current supply when said voltage switches to said portion of said pulse, thereby driving said voltage to said first value.

20. The method as described in claim 17 wherein said first value is approximately 50% or more greater in magnitude than a continuous voltage applied in a continuous DC sputter process having the same sputter rate.

21. The method as described in claim 17 wherein said sputtering is performed in the presence of a hydrogen-containing gas.

22. The method as described in claim 17 wherein an $sp^3$ content of the film as measured by reflection electron energy loss spectroscopy is approximately 70% or more.

23. The method as described in claim 17 wherein said power supply operates at a pulse frequency in the range of approximately 50–250 kHz.

24. The method as described in claim 17 wherein the pulse width is in the range of approximately 1–10 $\mu$-seconds.

25. The method as described in claim 17 wherein the substrate is biased during sputtering with respect to ground.

26. The method as described in claim 25 wherein the bias is applied at a voltage of 200 V negative or less.

27. The method as described in claim 17 wherein said carbon film is formed to a thickness of 10 nm or less.

28. The method as described in claim 17 wherein said carbon film is formed to a thickness of 5 nm or less.

29. A method of depositing a carbon film comprising sputtering from a target comprising carbon onto a substrate, wherein power is supplied to said target by a pulsed power supply, said pulsed power supply applying a negative voltage for at least a portion of a pulse, said portion further comprising a first value and a second value, said first value greater in magnitude than said second value, said first value greater than approximately 900 volts in magnitude.

30. The method as described in claim 29 wherein said power supply acts as a current supply when said power supply switches to said portion where said negative voltage is applied, thereby driving said voltage to said first value.

31. The method as described in claim 29 wherein said sputtering is performed in the presence of a hydrogen-containing gas.

32. The method as described in claim 29 wherein an $sp^3$ content of the film as measured by reflection electron energy loss spectroscopy is approximately 70% or more.

33. The method as described in claim 29 wherein said power supply operates at a pulse frequency in the range of approximately 50–175 kHz.

34. The method as described in claim 29 wherein the pulse width is in the range of approximately 1–10 $\mu$-seconds.

35. The method as described in claim 29 wherein the substrate is biased during sputtering with respect to ground.

36. The method as described in claim 33 wherein said bias is applied at a voltage of 200V negative or less.

37. The method as described in claim 29 wherein said carbon film is formed to a thickness of 10 nm or less.

38. The method as described in claim 29 wherein said carbon film is formed to a thickness of 5 nm or less.

39. The method as described in claim 29 further comprising forming said carbon film as a protective layer of a magnetic recording disk.

40. A method of depositing a carbon film comprising:
sputtering from a target onto a substrate, said target comprising carbon, said sputtering comprising:
applying a voltage to said target, said voltage applied by a power supply in a pulsed mode, said pulse comprising at least a first portion and a second portion, the voltage applied during said second portion more negative than that applied during said first portion, said second portion having an average voltage;
wherein a first sub-portion of said second portion is more negative than said average voltage of said second portion.

41. The method as described in claim 40 wherein said first sub-portion of said second portion occurs when said voltage switches from said first portion to said second portion.

42. The method as described in claim 41 wherein said power supply acts as a current supply when said voltage switches from said first portion to said second portion, thereby driving said voltage to the greater negative value during said first sub-portion of said second portion.

43. The method as described in claim 40 wherein said first portion further comprises a positive voltage spike at the beginning of said first portion.

44. The method as described in claim 40 wherein said first sub-portion of said second portion is approximately 50% or more greater in magnitude than a continuous voltage applied in a continuous DC sputter process having the same sputter rate.

45. The method as described in claim 40 wherein said sputtering is performed in the presence of a hydrogen-containing gas.

46. The method as described in claim 45 wherein said hydrogen-containing gas is one or more gas selected from the group consisting of hydrogen, ethylene, acetylene, butane, and naphthalene.

47. The method as described in claim 40 wherein an $sp^3$ content of the film as measured by reflection electron energy loss spectroscopy is approximately 70% or more.

48. The method as described in claim 40 wherein said power supply operates at a pulse frequency in the range of approximately 50–175 kHz.

49. The method as described in claim 40 wherein the pulse width is in the range of approximately 1–10 $\mu$-seconds.

50. The method as described in claim 40 wherein the substrate is biased during sputtering with respect to ground.

51. The method as described in claim 50 wherein the bias is applied at a voltage of 200V negative or less.

52. The method as described in claim 40 wherein said carbon film is formed to a thickness of 10 nm or less.

53. The method as described in claim 40 wherein said carbon film is formed to a thickness of 5 nm or less.

54. The method as described in claim 40 further comprising forming said carbon film as a protective layer of a magnetic recording disk.

55. The method as described in claim 40 wherein said first sub-portion of said second portion comprises a negative voltage spike.

56. A method of depositing a carbon film comprising:
sputtering from a target comprising carbon onto a substrate, wherein power is supplied to said target by a pulsed power supply, said pulsed power supply applying a negative voltage for at least a portion of a pulse, said portion further comprising a first value and an average voltage of said portion of said pulse, said first value 25% or more greater in magnitude than said average voltage.

57. The method as described in claim 56 wherein said first value comprises a spike at the beginning of the portion of the pulse where the negative voltage is applied.

58. The method as described in claim 56 wherein said power supply acts as a current supply when said voltage switches to said portion of said pulse, thereby driving said voltage to said first value.

59. The method as described in claim 56 wherein said first value is approximately 50% or more greater in magnitude than a continuous voltage applied in a continuous DC sputter process having the same sputter rate.

60. The method as described in claim 56 wherein said sputtering is performed in the presence of a hydrogen-containing gas.

61. The method as described in claim 56 wherein an $sp^3$ content of the film as measured by reflection electron energy loss spectroscopy is approximately 70% or more.

62. The method as described in claim 56 wherein said power supply operates at a pulse frequency in the range of approximately 50–250 kHz.

63. The method as described in claim 56 wherein the pulse width is in the range of approximately 1–10 $\mu$-seconds.

64. The method as described in claim 56 wherein the substrate is biased during sputtering with respect to ground.

65. The method as described in claim 64 wherein the bias is applied at a voltage of 200V negative or less.

66. The method as described in claim 56 wherein said carbon film is formed to a thickness of 10 nm or less.

67. The method as described in claim 56 wherein said carbon film is formed to a thickness of 5 nm or less.

* * * * *